United States Patent

Sung et al.

[11] Patent Number: 6,147,512
[45] Date of Patent: Nov. 14, 2000

[54] INPUT BUFFER CIRCUIT

[75] Inventors: Ha Min Sung; Jong Hoon Park, both of Choongcheongbuk-do, Rep. of Korea

[73] Assignee: LG Semicon Co., Ltd., Choongcheongbuk-Do, Rep. of Korea

[21] Appl. No.: 09/300,918

[22] Filed: Apr. 28, 1999

[30] Foreign Application Priority Data

Apr. 29, 1998 [KR] Rep. of Korea ................. 98-15318

[51] Int. Cl.[7] ............................................. H03K 19/0175
[52] U.S. Cl. .............................. 326/82; 326/86; 365/191
[58] Field of Search ............................ 326/82, 86, 105; 365/230.08, 230.02, 191

[56] References Cited

U.S. PATENT DOCUMENTS

| | | | |
|---|---|---|---|
| 4,794,567 | 12/1988 | Akatsuka | 365/189 |
| 5,305,282 | 4/1994 | Choi | 365/230.08 |
| 5,761,136 | 6/1998 | Park et al. | 365/191 |
| 5,926,043 | 7/1999 | Jang | 327/80 |

*Primary Examiner*—Michael Tokar
*Assistant Examiner*—Anh Tran
*Attorney, Agent, or Firm*—Morgan, Lewis & Bockius LLP

[57] ABSTRACT

An input buffer circuit includes a transition detecting unit for receiving an input signal, detecting a transition of the input signal, and outputting a detecting signal and a delayed input signal; a detecting signal summing unit for summing up the detecting signal and other detecting signals outputted from other transition detecting units, and outputting a plurality of summed signals; a buffer unit for transmitting the delayed input signal in accordance with the plurality of summed signals; a control signal generator for receiving one of the plurality of summed signals and a first control signal, and outputting a second control signal and a third control signal; and a write driver 204 for receiving the second and third control signals, and transmitting an output signal of the buffer unit to a cell by a trigger of the plurality of summed signals.

13 Claims, 7 Drawing Sheets

FIG. 4A
CONVENTIONAL ART
FIG. 4B
CONVENTIONAL ART
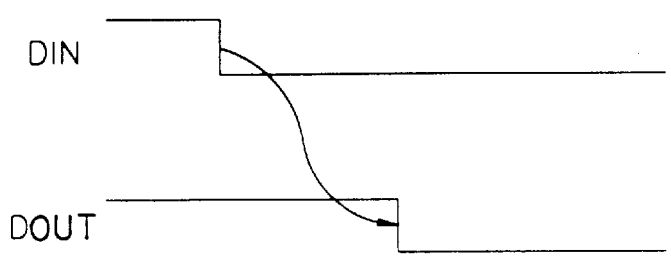
FIG. 4C
CONVENTIONAL ART
FIG. 4D
CONVENTIONAL ART
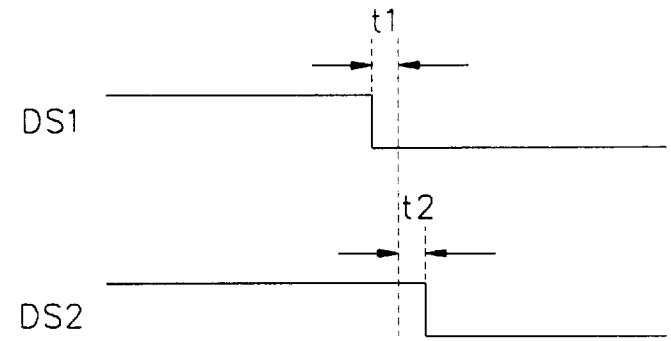

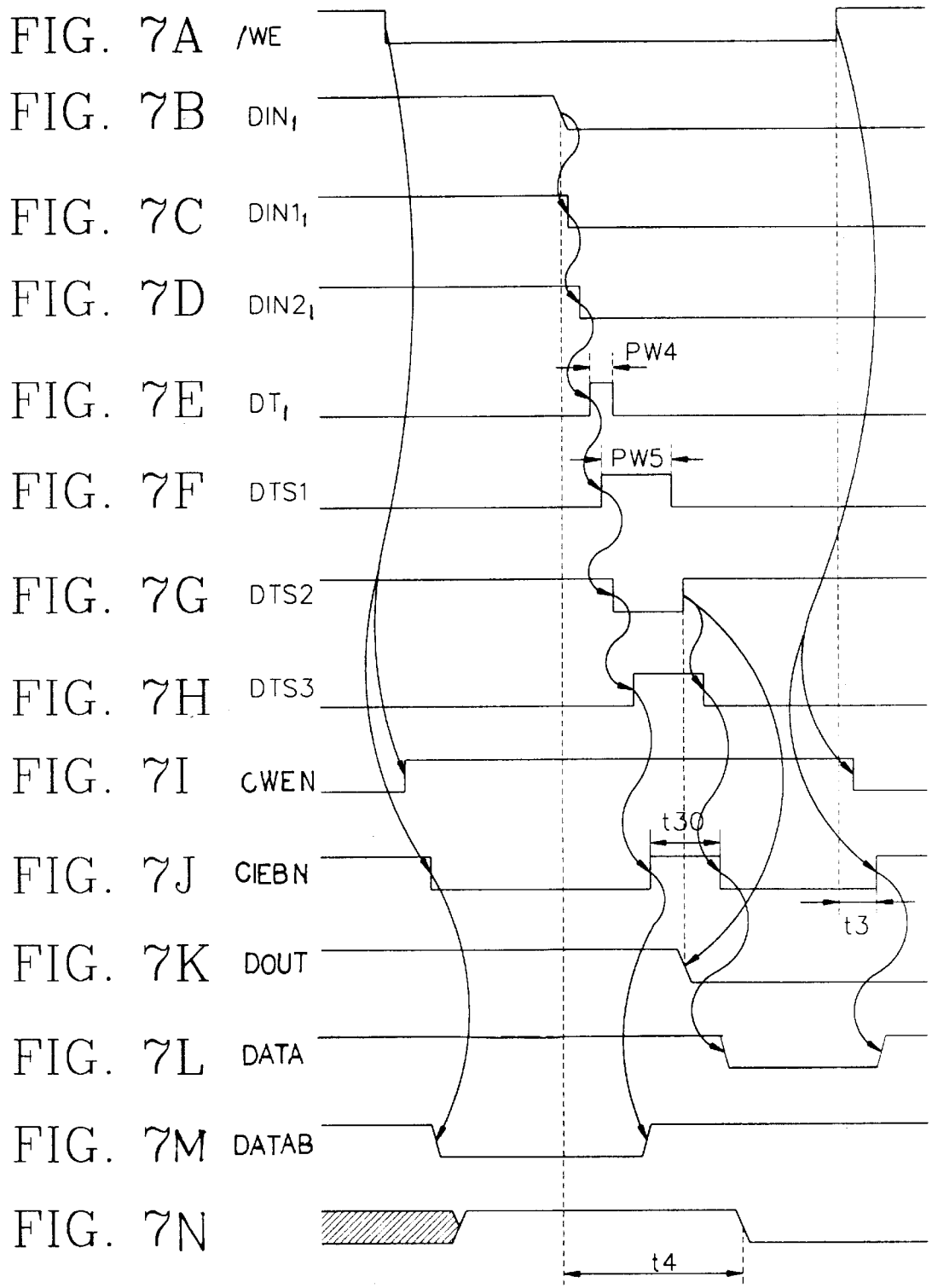

INPUT BUFFER CIRCUIT

BACKGROUND OF THE INVENTION

1. Field of the Invention

The present invention is directed to an input buffer circuit, and in particular, to an improved input buffer circuit capable of automatically and precisely controlling a timing of an input signal which is to be stored in a cell.

2. Discussion of the Related Art

The constitution of a conventional input buffer circuit will now be described with reference to FIGS. 1–4.

FIG. 1 is a structure diagram illustrating the conventional input buffer circuit and its peripheral circuits. The conventional input buffer circuit 100 includes an input unit 10, a transition detecting unit 20, and a selective delay unit 30. The input unit 10 receives an input signal DIN and a write signal /WE, and outputs a first input signal DIN1. The transition detecting unit 20 detects a transition of the first input signal DIN1 and a second input signal DIN2 generated by delaying the first input signal DIN1, and outputs a detecting signal $DT_1$. The selective delay unit 30 receives the first input signal DIN1, delays it for a predetermined time, and outputs an output signal DOUT.

The peripheral circuits of the input buffer circuit 100 include a detecting signal summing unit 102, a control signal generator 104, a writing driver 106, and a cell 108. The detecting signal summing unit 102 sums up the detecting signal DT and a plurality of detecting signals $DT_1$, $DT_2$, ..., DTn which are outputted from other input units (not illustrated), and outputs a summed signal DTS having a larger pulse width than a pulse width of the detecting signal $DT_1$. The control signal generator 104 receives the summed signal DTS, the write signal /WE and outputs a first control signal CWEN and a second control signal CIEBN. The writing driver 106 receives the output signal DOUT, and outputs a first output signal DATAB and a second output signal DATA pursuant to the first and second control signals CWEN and CIEBN. The cell 108 receives the first and second output signals DATAB and DATA.

FIG. 2 is a detailed structure diagram illustrating the conventional input buffer circuit 100.

The input unit 10 includes a NOR gate NR1 for receiving the write signal /WE and the input signal DIN, and an inverter I1 for inverting an output signal of the NOR gate NR1 and outputting the first input signal DIN1.

The transition detecting unit 20 includes an inverter I2, a delay 1, and an inverter I3 for receiving the first input signal DIN1, delaying the signal for a predetermined time, and outputting the second input signal DIN2. The transition detecting unit 20 also includes first and second transmission gates X1 and X2 for transmitting the first input signal DIN1 and an output signal of the inverter I2, pursuant to the output signal of the delay 1 and the output signal DIN2 of the inverter I3. An inverter I4 inverts transmission signals outputted from the first and second transmission gates X1 and X2, and outputs a detecting signal $DT_1$.

The selective delay unit 30 includes delay units 2, 3, 4 for receiving the second input signal DIN2 outputted from the inverter I3, and delaying the signal DIN2. First and second switches S1 and S2 switch both terminals of delay units 2 and 3 in order to control a delay time of the second input signal DIN2. An inverter I7 is positioned between the output terminal of the delay unit 2 and a terminal of the second switch S2, and an inverter I8 is positioned between a terminal of the second switch S2 and an input terminal of the delay unit 4.

The delay unit 2 includes inverters I5 and I6 serially connected to each other, and a PMOS transistor PM1 and an NMOS transistor NM1 functioning as a capacitor between the inverters I5 and I6. The delay unit 3 has the same structure as the delay unit 2. The delay unit 4 includes a plurality of inverters I9, ..., I9n which are serially connected.

The operation of the above-described input buffer circuit 100 will now be explained in detail.

FIGS. 3A to 3I are timing diagrams illustrating a process for an input signal to be stored in a cell by the conventional input buffer circuit 100.

When the write signal /WE illustrated in FIG. 3A is at a low level, the input unit 10 receives the input signal DIN transited from a high level to a low level, delays the input signal DIN for a predetermined time, and outputs the delayed input signal DIN1. The transition detecting unit 20 receives the delayed input signal DIN1, and outputs the detecting signal $DT_1$ having a predetermined pulse width PW1, as illustrated in FIG. 3C, by the transmission gates X1 and X2 in the transition detecting unit 20. As mentioned before, the delay 1 and inverter I3 control the transmission gates X1 and X2.

The detecting signal summing unit 102 receives the detecting signal $DT_1$ and other detecting signals $DT_1$, $DT_2$, ..., DTn, and outputs the summed signal DTS having a pulse width PW2 larger than the pulse width PW1 of the detecting signal $DT_1$, as illustrated in FIG. 3D.

When the control signal generator 104 receives the write signal /WE in a low level and the summed signal DTS, it outputs the second control signal CIEBN controlling the writing driver 106 by the summed signal DTS, as illustrated in FIG. 3F. On the other hand, when the control signal generator 104 receives the write signal /WE in a high level and the summed signal DTS, it outputs the first control signal CWEN by the write signal /WE in a high level, as illustrated in FIG. 3E, and does not operate the writing driver 106.

In the case that the second control signal CIEBN is in a high-level pulse width, as illustrated in FIG. 3G, when the output signal DOUT is inputted from the input buffer circuit 100 to the writing driver 106 (see FIG. 1), the output signal DOUT is stored in a cell. That is, circuit devices (not shown) provided in the writing driver receive the output signal DOUT in accordance with the high-level pulse of the second control signal CIEBN, and output the first and second output signals DATAB and DATA, respectively, as illustrated in FIGS. 3H and 3I, to the cell. As a result, the input data DIN is stored in the cell. Accordingly, when the second control signal CIEBN is in a high level, if the output signal of the buffer circuit is inputted to the writing driver, the inputted signal is stored in the cell.

The operation of the input buffer circuit 100 for controlling a timing of the output signal DOUT in order to output it to the writing driver 106 within a range of the high-level pulse width of the second control signal CIEBN will now be described.

When the input signal DIN illustrated in FIG. 4A is inputted to the selective delay unit 30 through the input unit 10 and transition detecting unit 20, the selective delay unit 30 outputs the output signal DOUT as illustrated in FIG. 4B.

If the output signal DOUT needs to be transmitted faster in order to be in the high-level pulse width of the second control signal CIEBN, both end portions of the delay unit 2 are shortened by the first switch S1. As illustrated in FIG. 4C, an output signal DS1 is outputted from the selective delaying unit 30 faster by an output time t1.

If the output signal DOUT is required to be transmitted to the writing driver 106 slower, both end portions of the delay unit 3 are connected by the second switch S2. As illustrated in FIG. 4D, an output signal DS2 is outputted from the selective delay unit 30 slower by an output time t2. Accordingly, the timing of the input signal DIN to be stored in the cell 108 can be controlled.

As discussed above, the conventional input buffer circuit 100 employs the selective delay unit 30 in order to control the timing for transmitting the input signal to the writing driver so that it can be stored in the cell 108. Here, the selective delay unit 30 includes the plurality of delay units 2, 3, 4 and the plurality of switches S1 and S2 for switching the delay units 2, 3, 4. In addition, the delay units 2 and 3 include MOS transistors functioning as a capacitor. However, the MOS transistors are easily influenced by a power supply voltage VCC, the surrounding temperatures, and other factors. Thus, the selective delay unit cannot define the delay time of the input signal precisely, making it difficult to control a timing of the input signal DIN to be stored in the cell.

SUMMARY OF THE INVENTION

Accordingly, the present invention is directed to an input buffer circuit that substantially obviates one or more of the problems due to limitations and disadvantages of the related art.

An object of the present invention is to provide an input buffer circuit which can automatically and precisely control a timing of an input signal to be stored in a cell.

Another object of the present invention is to provide an input buffer circuit cable of reducing a layout size of a semiconductor chip.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an input buffer circuit of the present invention includes an input unit receiving an input signal and a write signal; a transition detecting unit detecting a transition of the input signal and outputting a detecting signal; a detecting signal summing unit summing up the detecting signal and other detecting signals, and outputting summed signals; and an input buffer unit transmitting the input signal to the writing driver by the plurality of summed signals.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4A to 4D are timing diagrams of an output signal outputted from the conventional input buffer circuit;

FIGS. 7A to 7N are timing diagrams illustrating a process for an input signal to be stored in a cell by the input buffer circuit in accordance with the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
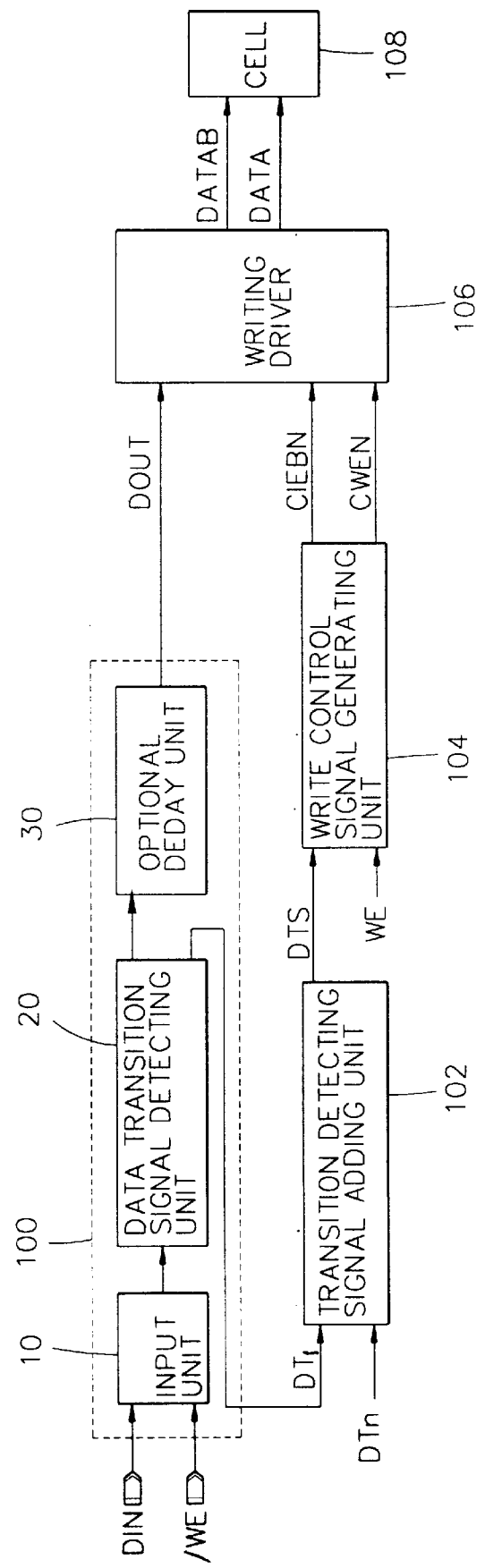
FIG. 1 is a block diagram illustrating a conventional input buffer circuit and its peripheral circuits.
Figure 2:
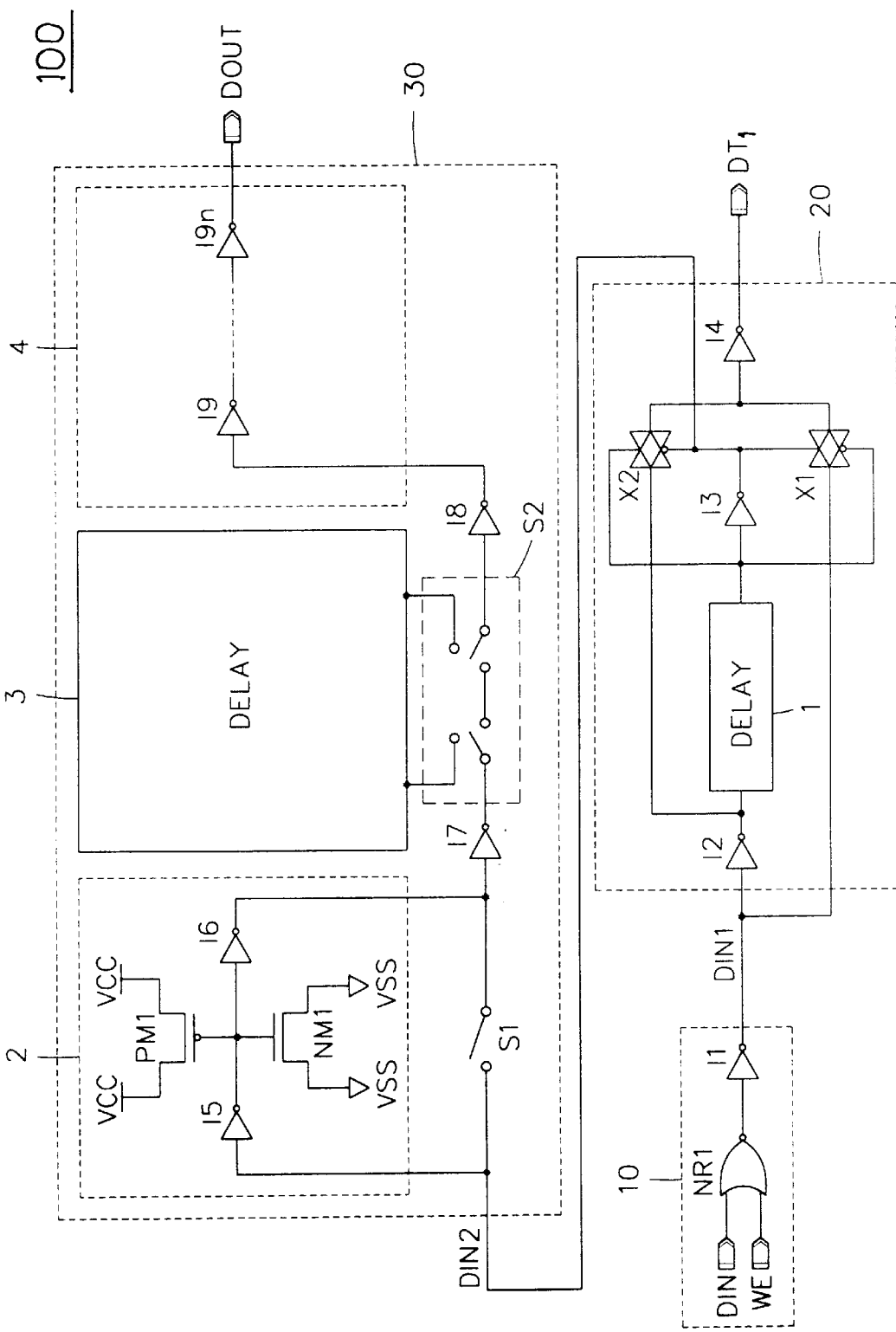
FIG. 2 is a detailed block diagram illustrating a conventional input buffer circuit.
Figures 3A, 3B, 3C, 3D, 3E, 3F, 3G, 3H, 3I:
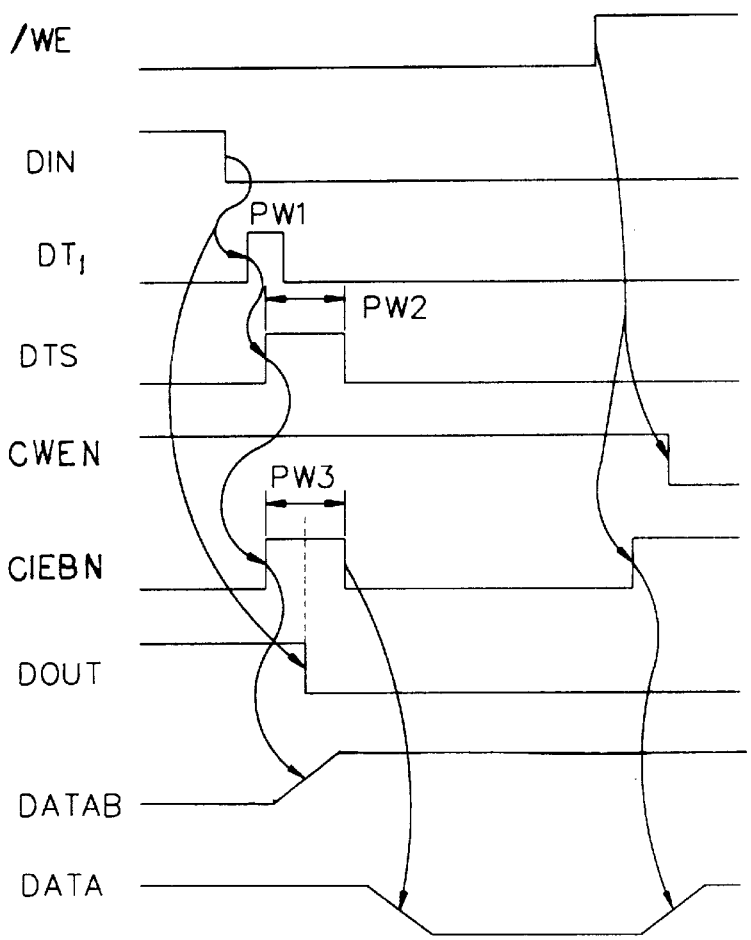
FIGS. 3A to 3I are timing diagrams illustrating a process for an input signal to be stored in a cell by the conventional input buffer circuit.
Figure 5:
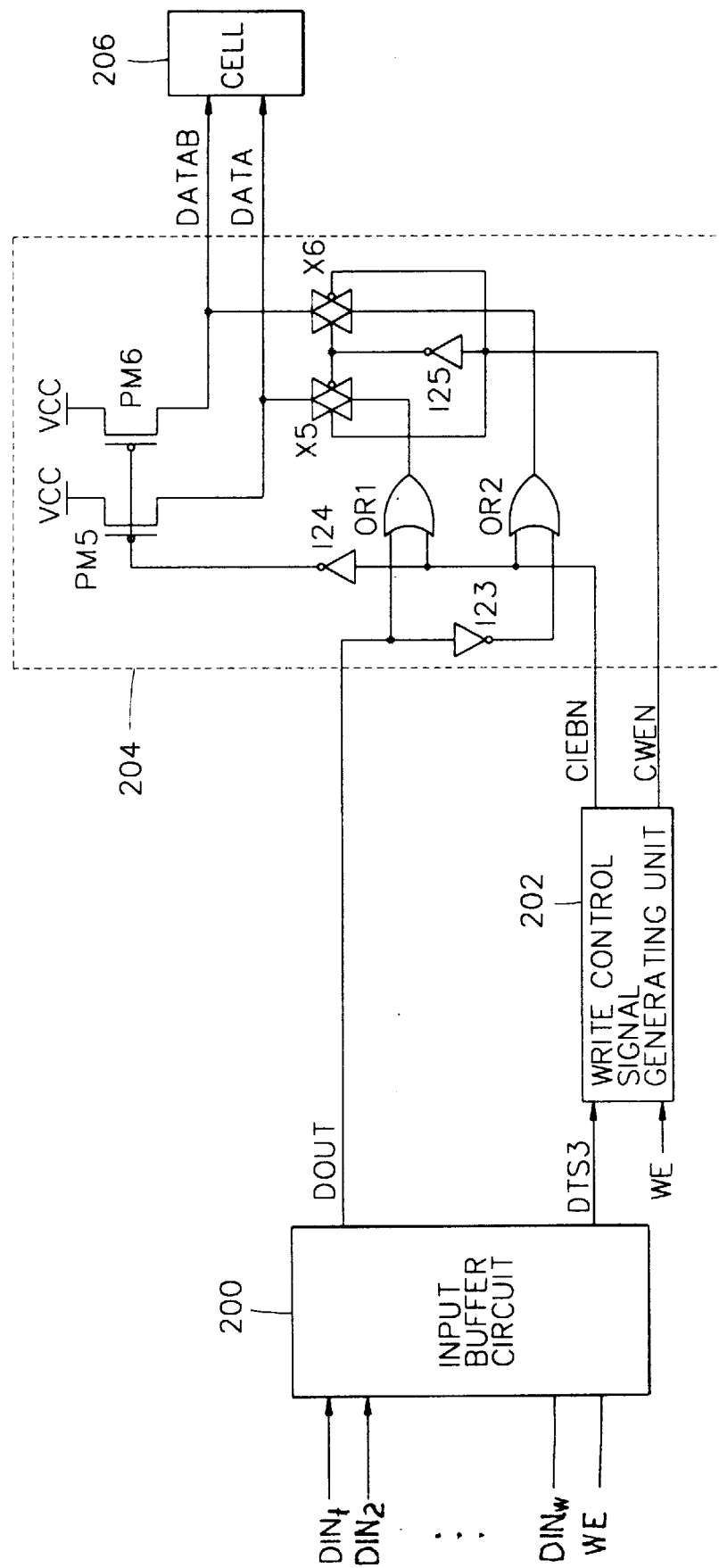
FIG. 5 is a structure diagram illustrating an input buffer circuit in accordance with the present invention and its peripheral circuits.

FIG. 5 illustrates an input buffer circuit according to the present invention and its peripheral circuits. As shown in FIG. 5, an input buffer circuit 200 receives an input signal DIN and a write signal /WE, and outputs a summed signal DTS3 and an output signal DOUT. A control signal generator 202 receives the summed signal DTS3, the write signal /WE and outputs first and second control signals CWEN and CIEBN. A writing driver 204 receives the output signal DOUT, and outputs first and second output signals DATAB and DATA in accordance with the first and second control signals CWEN and CIEBN. A cell 206 receives the first and second output signals DATAB and DATA from the writing driver 204.

The writing driver 204 includes an inverter I23 for inverting the output signal DOUT; an OR gate OR1 for receiving the output signal DOUT and the first control signal CWEN; an OR gate OR2 for receiving the inverted output signal DOUT and the second control signal CIEBN; an inverter I24 for inverting the first control signal; PMOS transistors PM5 and PM6 controlled by the inverted first control signal CWEN; an inverter I25 for inverting the second control signal CIEBN; and transmission gates X5 and X6 for transmitting the output signals of the OR gates OR1 and OR2 to first and second output signal lines in accordance with the inverted second control signal CIEBN and the second control signal CIEBN.

Figure 6:
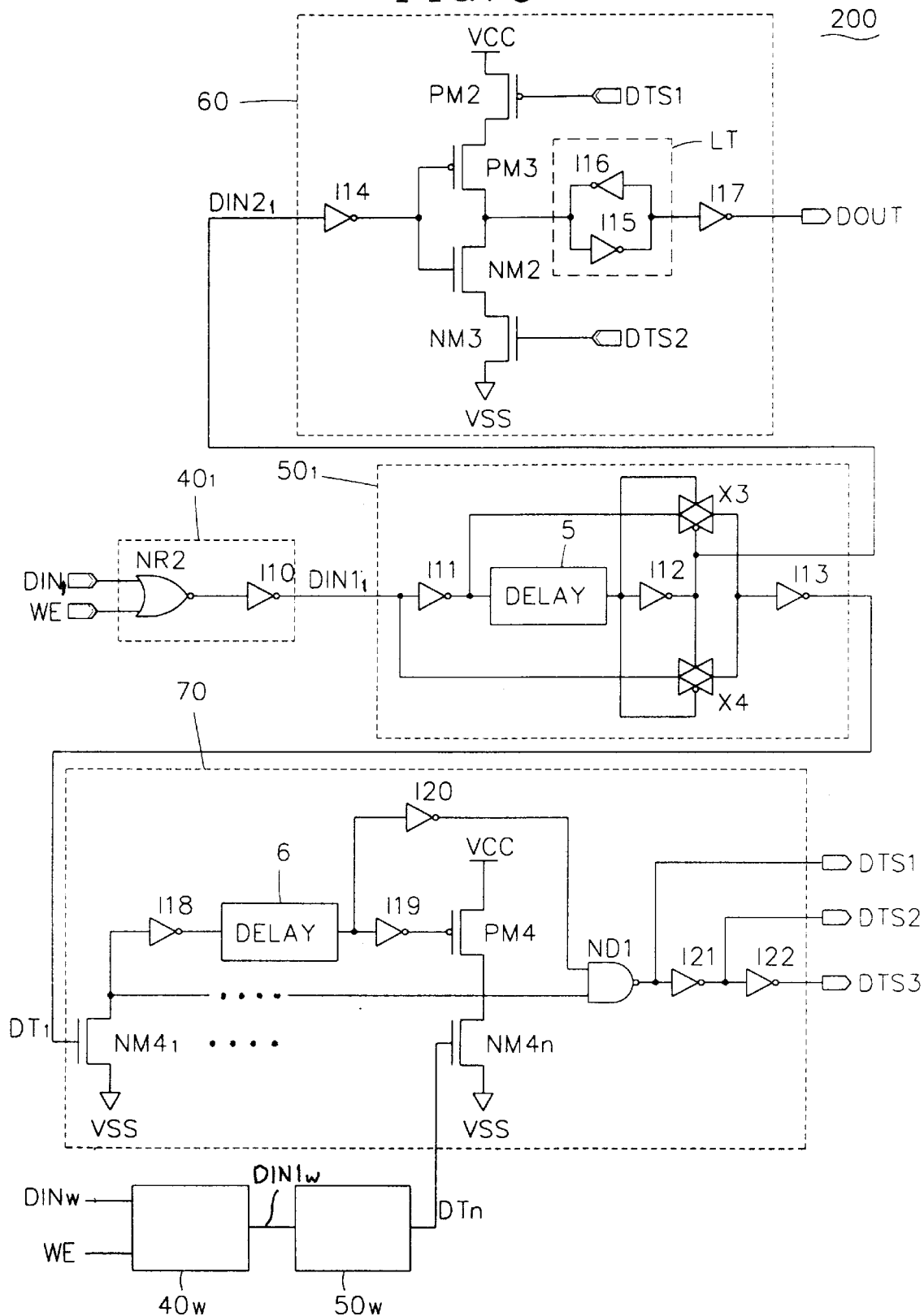
FIG. 6 is a detailed structure diagram illustrating the input buffer circuit in accordance with the present invention.

FIG. 6 is a detailed structure diagram illustrating the input buffer circuit 200 according to the present invention. As shown therein, the input buffer circuit 200 includes an input unit $40_1$, a transition detecting unit $50_1$, a detecting signal summing unit 70, and a buffer unit 60. The input unit $40_1$ receives the input signal $DIN_1$, and outputs a first input signal $DIN1_1$ in accordance with the write signal /WE. The transition detecting unit $50_1$ receives the first input signal $DIN1_1$, detects a transition of the first input signal $DIN1_1$, outputs a second input signal $DIN2_1$ generated by delaying the first input signal for a predetermined time, and outputs a detecting signal $DT_1$. The detecting signal summing unit 70 sums the detecting signal DT and other detecting signals $DT_2, \ldots, DTn$, and outputs first, second and third summed signals DTS1, DTS2, and DTS3. The buffer unit 60 receives the second input signal DIN2, and outputs the output signal DOUT in accordance with the first and second summed signals DTS1 and DTS2.

Each block of the input buffer circuit according to the present invention will now be explained in detail.

The input unit 40 includes a NOR gate NR2 for receiving the write signal /WE and the input signal $DIN_1$, and an inverter I10 for inverting an output signal of the NOR gate NR2 and outputting the first input signal $DIN1_1$.

The transition detecting unit 50 includes an inverter I11, a delay 5, and an inverter I12 for delaying the first input signal $DIN1_1$ and outputting the second input signal $DIN2_1$. Transmission gates X3 and X4 transmit the first input signal $DIN1_1$ and an output signal of the inverter I11 in accordance with an output signal of the delay 5 and an output signal of the inverter I12. An inverter I13 inverts output signals of the transmission gates X3 and X4, and outputs the detecting signal $DT_1$.

The detecting signal summing unit 70 includes a plurality of NMOS transistors $NM4_1, \ldots, NM4n$ for receiving the detecting signal $DT_1$ and other detecting signals $DT_2, \ldots,$ Dtn. An inverter I18, a delay 6, an inverter I19 and an inverter I20 are provided for delaying an output signal of the NMOS transistor $NM4_1$ in accordance with the detecting signal $DT_1$. A PMOS transistor PM4 is connected between a power supply voltage VCC and a drain of the NMOS transistor NM4n, and controlled by an output signal of the inverter I19. A NAND gate ND1 NANDs output signals outputted from drain terminals E, . . . , En of the NMOS transistors $NM4_1, \ldots, NM4n$ and an output signal of the inverter I20, and outputs the first summed signal DTS1. An inverter I21 inverts the first summed signal DTS1 and outputs the second summed signal DTS2. An inverter I22 inverts the second summed signal DTS2 and outputs the third summed signal DTS3.

The buffer unit 60 includes an inverter I14 for inverting the second input signal DIN2 and MOS transistors PM2 and NM3 operated by the first and second summed signals DTS1, DTS2, each terminal of which being respectively connected to the power supply voltage VCC and the ground voltage VSS. MOS transistors PM3 and NM2 output an output signal of the inverter I14 to a node C1 by the operation of the MOS transistors PM2 and NM3. Inverters I15 and I16 latch an output signal of the node C1, and output the signal to a node C2. An inverter I17 inverts an output signal of the node C2, and outputs the output signal DOUT.

The operation of the above-described input buffer circuit 200 will now be described with reference to FIGS. 7A to 7N. As illustrated in FIGS. 7A and 7B, in the case that the write signal /WE is in a low level, the input unit $40_1$ receives the input signal $DIN_1$ and outputs the first input signal $DIN1_1$, as shown in FIG. 7C. The transition detecting unit $50_1$ receives and delays the first input signal $DIN1_1$, and outputs the second input signal $DIN2_1$ illustrated in FIG. 7D and the detecting signal $DT_1$ having a predetermined width PW4 (see FIG. 7E). Then, the detecting signal summing unit 70 sums up the detecting signal DT and other detecting signals $DT_2, \ldots,$ DTn which are not illustrated, and outputs the first, second and third summed signals DTS1, DTS2, DTS3 having an identical pulse width PW5, as illustrated in FIGS. 7F, 7G and 7H.

The control signal generator 202 receives the write signal /WE and the third summed signal DT3, and as illustrated in FIGS. 7I and 7J, outputs the first and second control signals CWEN and CIEBN.

The buffer unit 60 receives the second input signal $DIN2_1$, and outputs the output signal DOUT, as illustrated in FIG. 7K, to the write driver 204 by the trigger of the first and second summed signals DTS1, DTS2 in a high-level pulse width PW5 of the second control signal CIEBN. Here, the second input signal $DIN2_1$ are transmitted in the high-level pulse width PW5 because the buffer unit 60 and the control signal generator 202 are operated by the first, second and third summed signals DTS1, DTS2, and DTS3. Therefore, a timing for the input signal $DIN_1$ to be stored in the cell is automatically and precisely controlled. When the input signal $DIN_1$ is inputted to the input buffer circuit 200, the first and second output signals DATA and DATAB illustrated in FIGS. 7L and 7M are outputted from the write driver 204 to the cell 206. Thus, the input signal $DIN_1$ is stored in the cell 206 as illustrated in FIG. 7N.

Accordingly, the input buffer circuit of the present invention automatically and exactly controls the timing of the input signal to be stored in the cell by using a plurality of summed signals, and stores the input signal in the cell through the write driver.

According to the input buffer circuit of the present invention, the timing for the input signal to be stored in the cell can be automatically and exactly controlled by using the summed signals. Because the input buffer circuit can control the pulse width t30 of the second signal CIEBN and transfer the signal DOUT will be in the width t30 to the cell node. Consequently, it is much easier to control the storage timing of the input signal to be stored in the cell. In addition, a time t4 (see FIG. 7N) between an input time of the input signal $DIN_1$ and a time for the input signal $DIN_1$ to be stored in the cell can be increased or decreased, thereby improving both a data setup time (the sum of t3 and t30, see FIGS. 7J) and a data hold time (the difference between t3 and t30), and reducing a layout size of a circuit.

It will be apparent to those skilled in the art that various modifications and variations can be made in the input buffer circuit of the present invention without departing from the spirit or scope of the invention. Thus, it is intended that the present invention cover the modifications and the variations of this invention provided they come within the scope of the appended claims and their equivalents.

What is claimed is:

1. An input buffer circuit comprising:
   a transition detecting unit for receiving an input signal, detecting a transition of the input signal, and outputting a detecting signal and a delayed input signal;
   a detecting signal summing unit for summing up the detecting signal and other detecting signals outputted from other transition detecting units, and outputting a plurality of summed signals;
   a buffer unit for transmitting the delayed input signal in accordance with the plurality of summed signals;
   a control signal generator for receiving one of the plurality of summed signals and a first control signal, and outputting a second control signal and a third control signal; and
   a write driver for receiving the second and third control signals, and transmitting an output signal of the buffer unit to a cell by a trigger of the plurality of summed signals.

2. The input buffer circuit of claim 1, further comprising:
   a NOR gate for receiving and NORing the input signal and the first control signal; and
   a first inverter for inverting an output signal of the NOR gate.

3. The input buffer circuit of claim 1, wherein the transition detecting unit comprises:
   a second inverter, a delay and a third inverter serially connected for delaying the input signal; and
   first and second transmission gates for outputting the detecting signal having a predetermined pulse width in accordance with output signals of the delay and the third inverter.

4. The input buffer circuit of claim 3, wherein the transition detecting unit further comprises a fourth inverter for inverting output signals of the first and second transmission gates and generating the detecting signal.

5. The input buffer circuit of claim 1, wherein the detecting signal summing unit comprises:

a plurality of NMOS transistors for receiving the detecting signal and the other detecting signals through gate terminals of the NMOS transistors;

a fifth inverter, a delay, a sixth inverter and a seventh inverter for delaying an output signal derived from the detecting signal;

a PMOS transistor connected between a power supply voltage and drain terminals of the plurality of NMOS transistors, and receiving an output signal of the sixth inverter through a gate of the PMOS transistor; and a NAND gate and a plurality of inverters for NANDing and inverting output signals of the plurality of NMOS transistors and an output signal of the seventh inverter, and outputting the plurality of summed signals, the NAND gate and the plurality of inverters being serially connected.

6. The input buffer circuit of claim 5, wherein the plurality of summed signals comprises:

a first summed signal outputted from the NAND gate;

a second summed signal outputted from an eighth inverter to which the first summed signal is inputted; and a third summed signal outputted from a ninth inverter to which the second summed signal is inputted.

7. The input buffer circuit of claim 6, wherein the first summed signal and the second summed signal control the buffer unit.

8. The input buffer circuit of claim 1, wherein the buffer unit comprises:

a first pair of MOS transistors serially connected for receiving the delayed input signal;

a second pair of MOS transistors for respectively connecting each terminal of the first pair of MOS transistors to a power supply voltage and a ground voltage; and a pair of inverters for latching an output signal for a node of the first pair of MOS transistors.

9. The input buffer circuit of claim 8, wherein the buffer unit further comprises;

a tenth inverter for inverting the delayed input signal; and an eleventh inverter for inverting the output signal latched by the pair of inverters.

10. The input buffer circuit of claim 1, wherein the second control signal is triggered by the first control signal and is an opposite logic signal to the first control signal, and the third control signal is triggered by the first control signal and said one of the plurality of summed signals, and has an identical pulse width as said one of the plurality of summed signals.

11. The input buffer circuit of claim 10, wherein the third control signal is triggered by the first control signal and said one of the plurality of summed signals, and has an identical pulse width as said one of the plurality of summed signals and has a high level.

12. The input buffer circuit of claim 11, wherein the delayed input signal is transmitted if one of the summed signals triggers during a time equal to the pulse width of said one of the plurality of summed signals.

13. The input buffer circuit of claim 12, wherein the delayed input signal is transmitted if one of the summed signals triggers only during a time equal to the pulse width of said one of the plurality of summed signals.

* * * * *